US006956743B2

(12) United States Patent
Miller et al.

(10) Patent No.: US 6,956,743 B2
(45) Date of Patent: Oct. 18, 2005

(54) ELECTRONIC COMPONENT, IN PARTICULAR REGULATOR FOR GENERATORS IN MOTOR VEHICLES

(75) Inventors: Hans-Peter Miller, Stuttgart (DE); Andreas Doeffinger, Leonberg (DE); Achim Henkel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 245 days.

(21) Appl. No.: 10/638,767

(22) Filed: Aug. 11, 2003

(65) Prior Publication Data

US 2004/0057215 A1 Mar. 25, 2004

(30) Foreign Application Priority Data

Sep. 20, 2002 (DE) ........................................ 102 43 981

(51) Int. Cl.[7] ................................................. H06K 7/20

(52) U.S. Cl. ...................... 361/719; 361/709; 257/706; 322/28

(58) Field of Search ................................ 361/702–712, 361/717–719, 720–721; 257/706–719, 687, 690; 363/144, 145, 146, 147; 310/680, 52, 58, 45, 68 R, 64; 322/28, 70, 25, 26, 17; 174/52.2

(56) References Cited

U.S. PATENT DOCUMENTS

| | | | | | |
|---|---|---|---|---|---|
| 3,439,255 | A | * | 4/1969 | Carnes et al. | 322/28 |
| 3,501,582 | A | * | 3/1970 | Heidler et al. | 174/52.2 |
| 3,539,907 | A | * | 11/1970 | Linstedt | 322/28 |
| 3,582,762 | A | * | 6/1971 | Mori et al. | 257/706 |
| 3,876,926 | A | * | 4/1975 | Schott et al. | 322/28 |
| 5,677,616 | A | * | 10/1997 | Ooiwa | 322/17 |
| 5,747,875 | A | * | 5/1998 | Oshima | 257/687 |
| 6,271,607 | B1 | * | 8/2001 | Vandenbossche | 310/68 D |
| 6,664,674 | B2 | * | 12/2003 | Ihata | 310/64 |

FOREIGN PATENT DOCUMENTS

| | | | | |
|---|---|---|---|---|
| DE | 44 19 215 A1 | | 12/1995 | |
| EP | 000258691 A2 | * | 3/1988 | H02J/7/14 |

* cited by examiner

*Primary Examiner*—Michael Datskovskiy
(74) *Attorney, Agent, or Firm*—Michael J. Striker

(57) ABSTRACT

An electronic component formed as a regulator for generators in motor vehicles has an IC block arranged on a cooling body, connectors provided with conductors, bond wire connectors connecting the IC block with the conductors, the conductors being provided at first ends which face the IC block with a first bond pad, forming a limited free space behind the first bond pad as seen from the IC block for insertion and withdrawal of a bond tool, the conductors of the plug connectors being each provided with a second bond pad located behind the limited free space at a distance from the first bond pad, for further bond wire connections of at least one selectively useable electronic component.

10 Claims, 2 Drawing Sheets

ELECTRONIC COMPONENT, IN PARTICULAR REGULATOR FOR GENERATORS IN MOTOR VEHICLES

BACKGROUND OF THE INVENTION

The present invention relates to an electronic component, in particular to a regulator for generators in motor vehicles, with an IC block.

A known regulator with IC blocks is disclosed for example in the German patent document DE 44 19 21. In this regulator different structural sizes are used for different powers, and the power dissipation of the IC components must be withdrawn outwardly through correspondingly dimensioned cooling bodies. Additional functions of the regulator, for example a protection from voltage peaks from outside, are realized by additional semiconductor ICs and/or separate components used in the regulator. Both the additional components as well as their connections through bond wire connections require a sufficiently large space in the regulator housing. Therefore, the disadvantage of this construction is the required large dimensions of the regulator. Since moreover the electronic components and the connections for protection against corrosion must be covered with silicone gel as casting compound, this constitutes an additional disadvantage of this construction, in that with increasing cover surfaces the required gel quantity increases as well. In rough vehicle applications of the regulator, this leads in some situations in the event of occurring vibrations, to loosening of silicone gel or damages to the connections of the electronic components. Since furthermore the surface covered with the silicone gel is limited by a frame, a sufficient space must be provided on this surface for the insertion and withdrawal of bond tools in the frame.

SUMMARY OF THE INVENTION

Accordingly, it is an object of the present invention to provide an electronic component, in particular a regulator for generators of motor vehicles, which avoids the disadvantages of the prior art.

More particularly, it is an object of the present invention to provide an electronic component, in particular a regulator in which a space required for mounting and connection of an IC unit and at least one selectively additionally used electronic component is maintained as small as possible.

In keeping with these objects and with others which will become apparent hereinafter, one feature of the present invention resides, briefly stated, an electronic component formed as a regulator for generators in motor vehicles, comprising an IC block arranged on a cooling body; connectors provided with conductors; connectors provided with conductors; bond wire connectors connecting said IC block with said conductors; said conductors being provided at first ends which face said IC block with a first bond pad; means forming a limited free space behind said first bond pad as seen from said IC block for insertion and withdrawal of a bond tool; said conductors of said plug connectors being each provided with a further bond pad located behind said limited free space at a distance from said first bond pad, for further bond wire connections of at least one selectively useable electronic component.

When the electronic component, in particular a regulator for generators and motor vehicles is designed in accordance with the present invention, it has the advantage that with the same mounting space the conductors leading to the plug connections are utilized both for a regulator with additional electronic components, as well as for a regulator without additional components. A further advantage is that the surface covered by the corrosion protection gel in the regulator is not increased or increased only minimal with the possibilities of a selective arrangement of additional electronic components via the corresponding second bond point. A further advantage is that with the selective use of discreet additional components the bond wire connections can be maintained short, in order to avoid mechanical vibrations during the operation. Finally, with the use of additional discrete components, the electrical robustness of the regulator increases, which otherwise can be realizable in a very expensive manner by monolithic integration on the IC block.

In accordance with a further feature of the present invention, in order to limit the space covered by the casting compound, the distance between the first and the second bond pad of the conductors can be used many times as a limited free space for the insertion and withdrawal of the bond tool to both bond pads.

Furthermore, for obtaining short bond wire connections it is advantageous when the bond wire connections of the IC blocks are connected selectively directly to the first bond pad or indirectly to the second bond pad through at least one additional electronic component.

In a simple manner the conductors can be embedded as conductor rails, preferably as insert parts, continuously into the insulating material.

In accordance with the preferable embodiment of the present invention, several additional electronic components can be connected on a substrate plate, which is arranged between the IC block and the second bond pad of the conductors, and therefore preferably abut against the first bond pad on the ends of the IC block which face the conductors. The IC block, the selective additional substrate plate with the discrete electronic components and the bond pad of the conductors are surrounded by a frame and covered by a cast compound inside the frame.

On the substrate plate, in some cases, further regions can be used for producing connections to other potentials, such as for example to plus or ground.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

The drawings show a regulator 15, 15*a* for a three-phase generator which at the output side is supplied with power from a rectifier unit of the electrical system of the motor vehicle. The excitation current is regulated in dependence on the voltage of the electrical system of the vehicle at the output of the rectifier unit, via the regulator 15, 15*a*.

Figure 1:
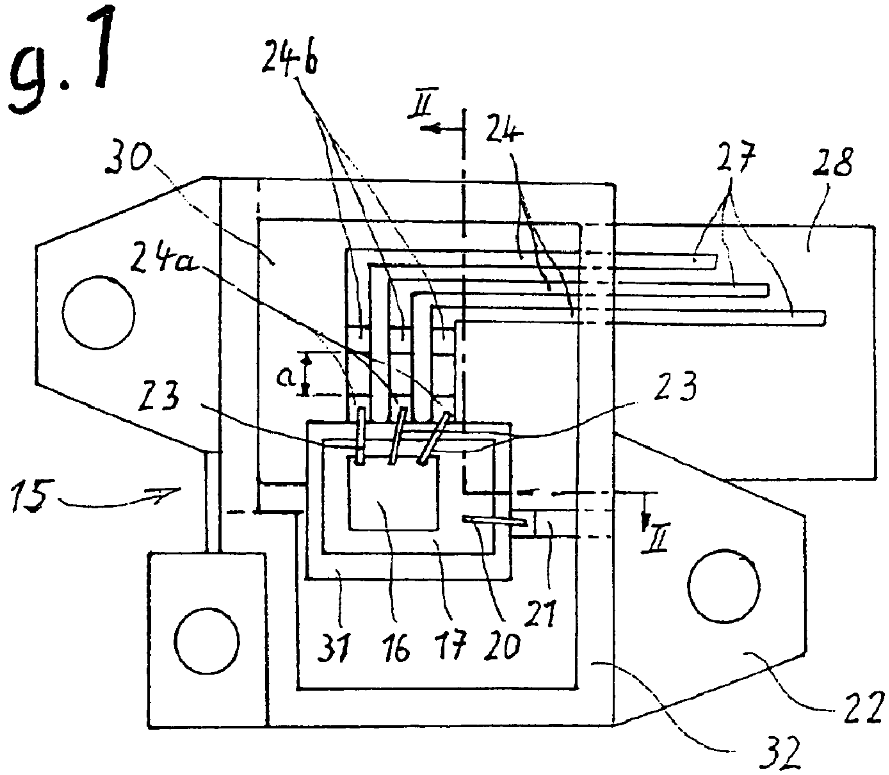
FIG. 1 shows a regulator for motor vehicle generators without a cover, with its IC block and without additional components, on a plan view.
Figure 2:
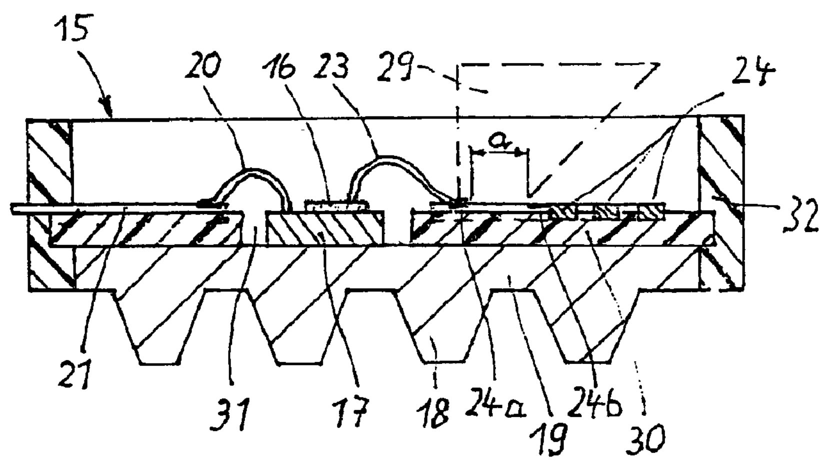
FIG. 2 is a view showing a cross-section of the regulator in accordance with the present invention, taken along the line II—II in FIG. 1.

FIGS. 1 and 2 show the open regulator 15 in an embodiment with an IC block 16 without additional discrete components. For taking up the spent heat in the IC block 16, it is directly glued to a metal block 17. The metal block 17 sits on a relatively large cooling body 19 provided with cooling ribs 18, through which the spent heat of the IC block 16 received by the metal block 17 can be withdrawn in a distributed way by a cooling air flow of the generator. The metal block 17 is connected with ground potential through a bond wire connection 20. In particular the bond wire connection 20 leads to a tongue 21 of a connector plate 22, which is connected to the ground of the three-phase generator.

Furthermore, the IC block 16 is electrically connected through three adjacently located bond wire connections 23 with three adjacently located conductors in form of conductor rails 24 which lead to plug connectors 27 of a plug part 28. The conductor rails 24 at their ends which face the IC block 16 are provided each with a first bond pad 24*a*. For connection of the bond wires to this first bond pad 24, a limited free space 29 is provided behind this bond pad, as seen from the IC block 16, for producing the bond connections shown in a broken line in FIG. 2. The free space 29 is required for introduction and withdrawal of a bond tool.

As can be seen from FIG. 2, the conductor rails 24 are embedded as inserts into the insulating material of a base plate 30. The base plate 30 has a window 31 for the arrangement of the metal block 17 with the IC block 16. The IC block 16 with the metal block 17 as well as the base plate 30 with the conductor rails 24 are surrounded together with the cooling body 19 by a frame 32. The space inside the frame 32 with the components arranged in it is covered by a not shown casting component for corrosion protection.

In order to selectively equip the regulator 15 with additional components, the conductor rails 24 are provided each with a further bond pad 24*b* behind the limited free space 29, at a distance a from their first bond pad 24*a*, for selectively connecting additional electronic components. The distance a between the first and the second bond pad 24*a* and 24*b* of the conductor rails 24 is selected so that it forms a multi-purpose limited free space for the insertion of the bond tool to and withdrawal of the bond tool from both bond pads of each conductor rail 24, as can be seen from FIG. 4.

In the embodiment of FIGS. 1 and 2 the regulator 15 is designed in a single embodiment only with the IC block 16, whose bond wire connections 23 are directly connected, through the first bond pad 24*a* with the conductor rails 24 of the plug connections 24 on the plug part 28. The regulator 15 can provide additional functions and higher safety standards by additional components, wherein in this case the second bond pad 24*b* can be utilized.

Figure 3:
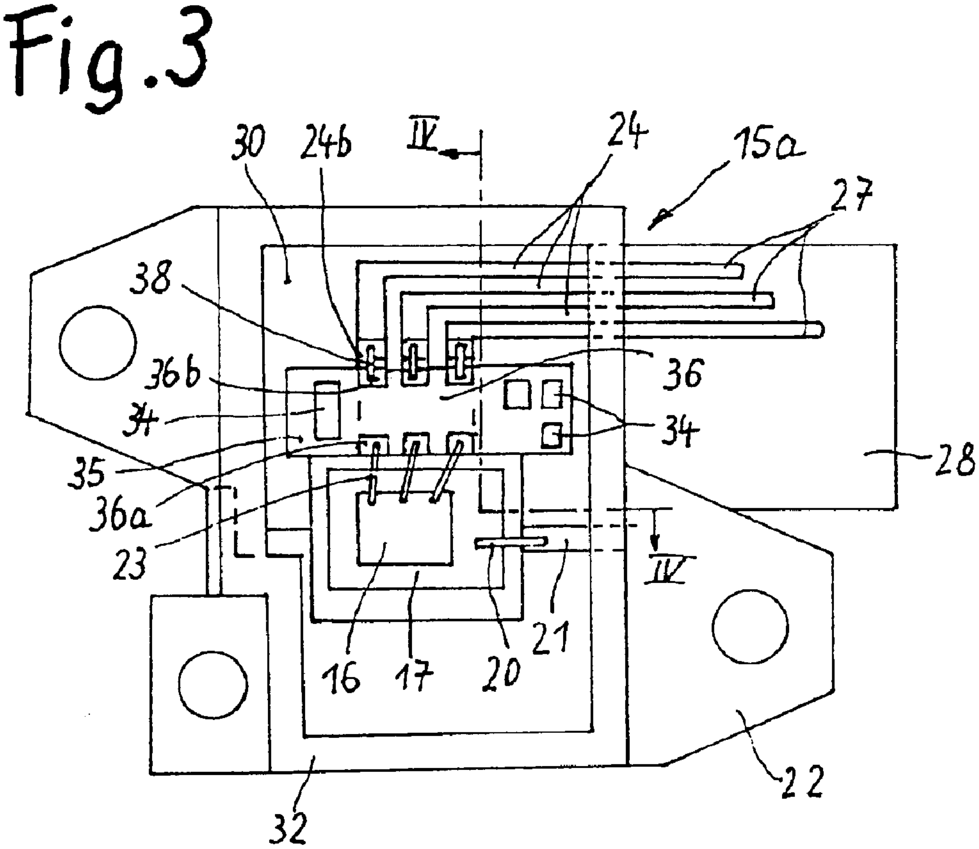
FIG. 3 is a view showing the regulator of FIG. 1 with additional components on an alternatively used substrate plate.
Figure 4:
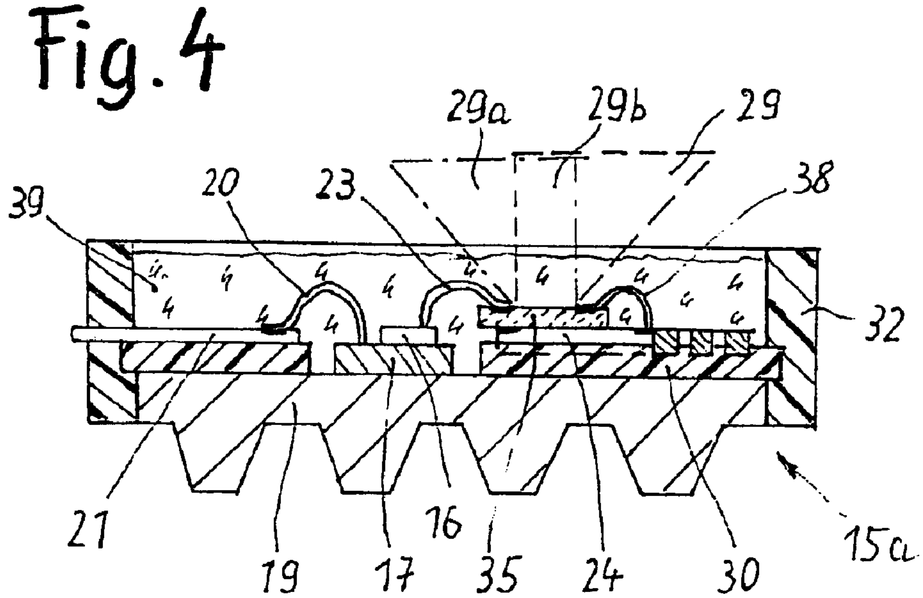
FIG. 4 is a view showing a section of the regulator of FIG. 3, taken along the line IV—IV.

FIGS. 3 and 4 show such an embodiment of the regulator 15*a*. There, in addition to the IC block 16, additional electronic components 34 for a higher operational safety of the regulator 15*a* are provided on a substrate plate 35 in a known SMD technique and connected in a connection region 36. The substrate plate 35 is arranged between the IC block 16 and the second bond pad 24*b* of the conductor rails 24 and abuts against the ends of the conductor rails 24 with the first bond pad 24*b*. It is fixed on the base plate 30. The bond wire connections 38 of the IC block 16 are contacted first with the further bond pads 36*a* in the connection region 36 of the substrate plate 35 and from there are connected to the second bond pad 24*b* of the conductor rails 24 through further bond wire connections 38. The IC block 16 in this embodiment is therefore indirectly connected through the substrate plate 35 with the additional electronic components 34 to the plug connections 27 of the plug part 28.

FIG. 4 shows how in this case the free space 29 between the first and second bond pads can be used many times for insertion and withdrawal of the bond tool for producing the bond wire connections 23 and 38 in the connection region 36 of the substrate plate 35. There first the bond wire connections 23 of the IC block 16 are guided with a not shown bond tool to the connection region 36 of the substrate plate 35 and connected there to the first bond pad 36*a*. The required free space 29 for the bond tool is shown in FIG. 4 in a broken line. Subsequently the bond tool and the regulator 15*a* are turned by 180° relative to one another. Now the bond wire connections 38 are guided by the bond tool correspondingly from the second bond pad 24*b* of the conductor rails 24 to the connection region 36 on the substrate plate 35 and contacted there with the bond pad 36*b*. The bond tool is inserted into and withdrawn from the free space 29*b* shown in a broken line, in the connection region 36. The substrate plate 35 in the connection region 36 intersects the free spaces 29, 29*a* required by the bond tool. This intersecting region 29*b* corresponds substantially to the distance a between the first and second bond pad 24*a* and 24*b* of FIG. 1. The bond wire connection 20 between the metal block 17 and the connection plate 22 remains unchanged.

The free space 29 which in accordance with the first embodiment of FIG. 2 is required for the movement of the bond tool for connection of the bond wires 23 to the first bond pad 24*a*, is arranged in accordance with the present invention so that when the regulator 15 is equipped with additional components in accordance with the second embodiment of FIG. 4, it can be used both for placement of the substrate plate 35 with the additional electronic component 34 and also for connection of these additional components to the IC block 16 on the one hand and to the conductor rails 24 on the other hand. For both embodiments of the regulator 15 the same plug parts 28 with the conductor rails 24 are utilized. After producing the bond connections, the inner space of the frame 32 is filled with a silicone gel 39 above the base plate 30 as shown in FIG. 4.

It will be understood that each of the elements described above, or two or more together, may also find a useful application in other types of constructions differing from the types described above.

While the invention has been illustrated and described as embodied in electronic component, in particular regulator for generators in motor vehicles, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

What is claimed is:

1. An electronic component formed as a regulator for generators in motor vehicles, comprising an IC block arranged on a cooling body; plug connectors provided with conductors; bond wire connectors connecting said IC block with said conductors; said conductors being provided at first ends which face said IC block with a first bond pad; means forming a limited free space behind said first bond pad as seen from said IC block for insertion and withdrawal of a bond tool; said conductors of said plug connectors being each provided with a second bond pad located behind said limited free space at a distance from said first bond pad, for further bond wire connections of at least one selectively useable electronic component.

2. An electronic component as defined in claim 1, wherein a distance between said first bond pad and said second bond pad of said conductors forms said limited free space so that it can be useable for multiple for insertion and withdrawal of a bond tool for both said bond pads.

3. An electronic component as defined in claim 2, wherein said bond wire connectors of said IC component are connectable selectively directly to said first bond pad or indirectly to said second bond pad through at least one additional electronic component.

4. An electronic component as defined in claim 3, wherein said conductors are embedded as conductor rails into an insulating material.

5. An electronic component as defined in claim 4, wherein said conductor rails are formed as inserts.

6. An electronic component as defined in claim 3; and further comprising a substrate plate; and a plurality of additional electronic components connected on said substrate plate.

7. An electronic component as defined in claim 6, wherein said substrate plate is arranged between said IC block and said second bond pad of said conductors.

8. An electronic component as defined in claim 6, wherein said substrate plate is arranged at ends of said conductors with said first bond pad, which ends face toward said IC block.

9. An electronic component as defined in claim 8, wherein said substrate plate in a region of said free space has a connection region in which said bond wire connections of said IC block and also further bond wire connections of said second bond pad of said conductors are located for a multiple use of said free space for insertion and withdrawal of the bond tool.

10. An electronic component as defined in claim 1; and further comprising a frame which surrounds said IC block and selectively at least one additional electronic component and said bond pads of said conductors; and a casting compound provided inside said frame for corrosion protection.

* * * * *